(12) United States Patent
Carcasi

(10) Patent No.: US 8,178,820 B2
(45) Date of Patent: May 15, 2012

(54) METHOD AND HEAT TREATMENT APPARATUS FOR UNIFORMLY HEATING A SUBSTRATE DURING A BAKE PROCESS

(75) Inventor: Michael A. Carcasi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 1049 days.

(21) Appl. No.: 12/059,342

(22) Filed: Mar. 31, 2008

(65) Prior Publication Data
US 2009/0246723 A1 Oct. 1, 2009

(51) Int. Cl.
*H05B 3/68* (2006.01)
*F27D 5/00* (2006.01)
*C23C 16/00* (2006.01)

(52) U.S. Cl. ........................ 219/444.1; 432/253; 118/725

(58) Field of Classification Search ............... 219/443.1, 219/444.1, 448.11, 448.12; 432/253; 118/724, 118/725; 414/935–941
See application file for complete search history.

(56) References Cited

U.S. PATENT DOCUMENTS 6,402,509 B1 * 6/2002 Ookura et al. ................ 432/253
2006/0241891 A1 * 10/2006 Kaushal et al. ............... 702/136

* cited by examiner

*Primary Examiner* — Sang Paik
(74) *Attorney, Agent, or Firm* — Wood, Herron & Evans, LLP

(57) ABSTRACT

A heat treatment apparatus and associated method are provided for heating a substrate. The apparatus includes a processing chamber containing a process space, first and second substrate supports, and first and second heating sources. The first substrate support is configured to support the substrate in a spaced relationship with the first heating source to define a heat exchange gap and to transfer heat energy through the heat exchange gap to elevate a temperature of the substrate to an offset temperature below a process target temperature. The second substrate support is configured to support the substrate in a spaced relationship with a second heating source to define a heat exchange gap between the second heating source and the substrate and to transfer heat energy through the heat exchange gap to elevate the temperature of the substrate from the offset temperature to the process target temperature in controlled increments.

13 Claims, 10 Drawing Sheets

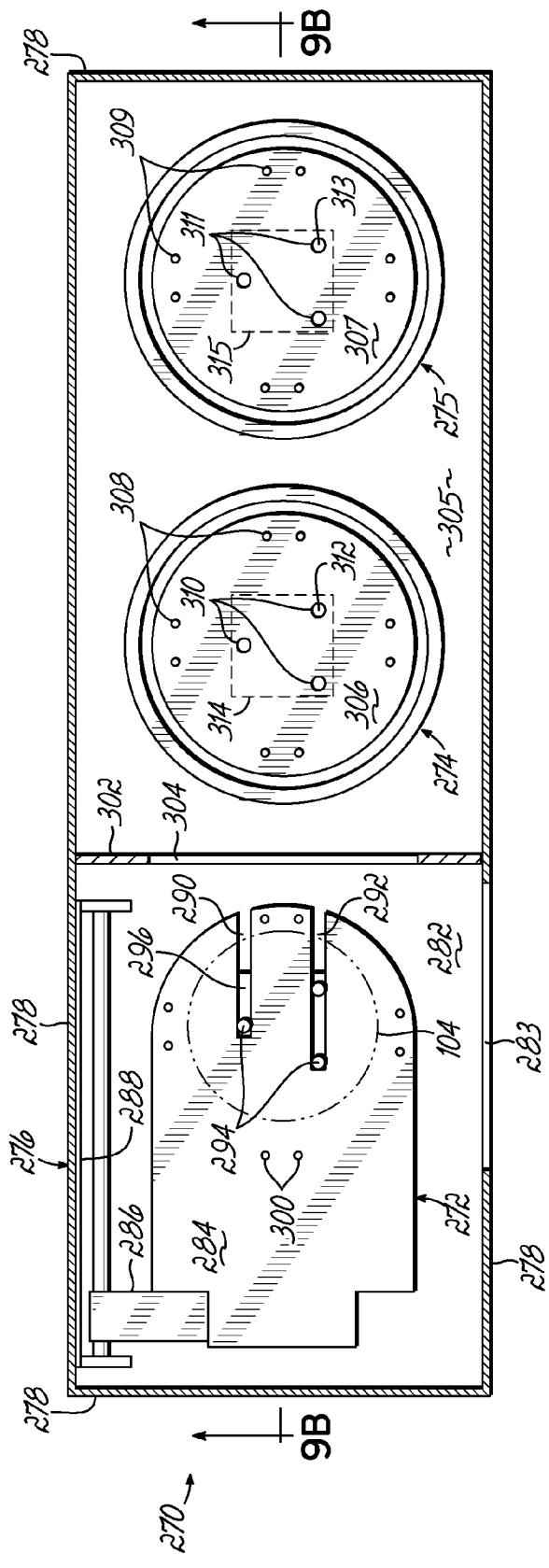
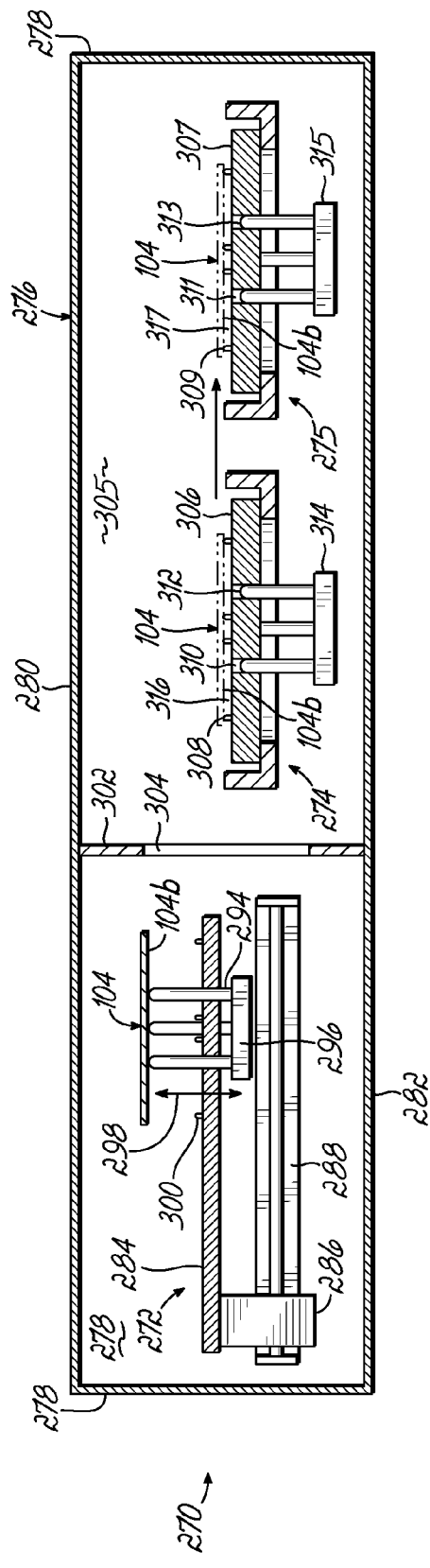
FIG. 9A
FIG. 9B

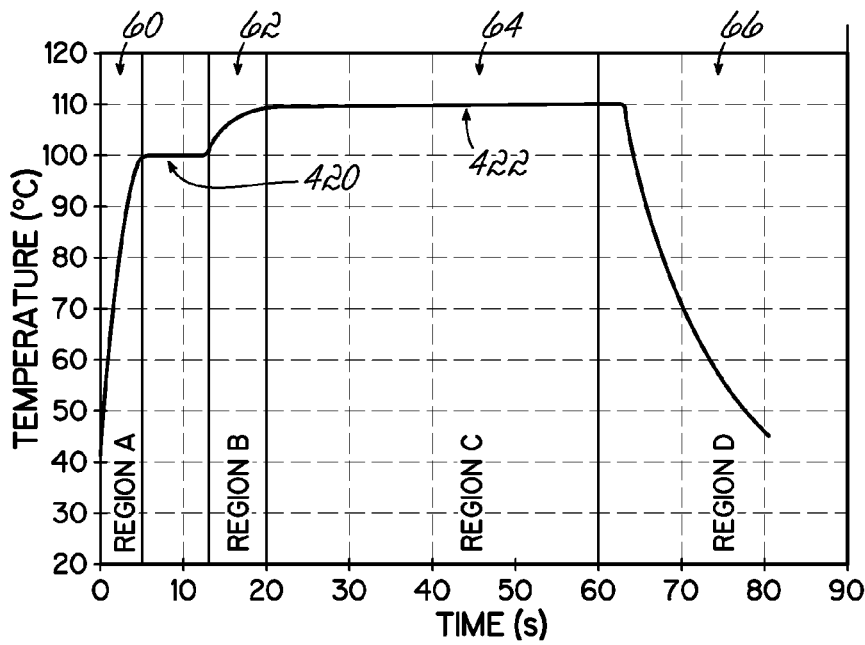
FIG. 12
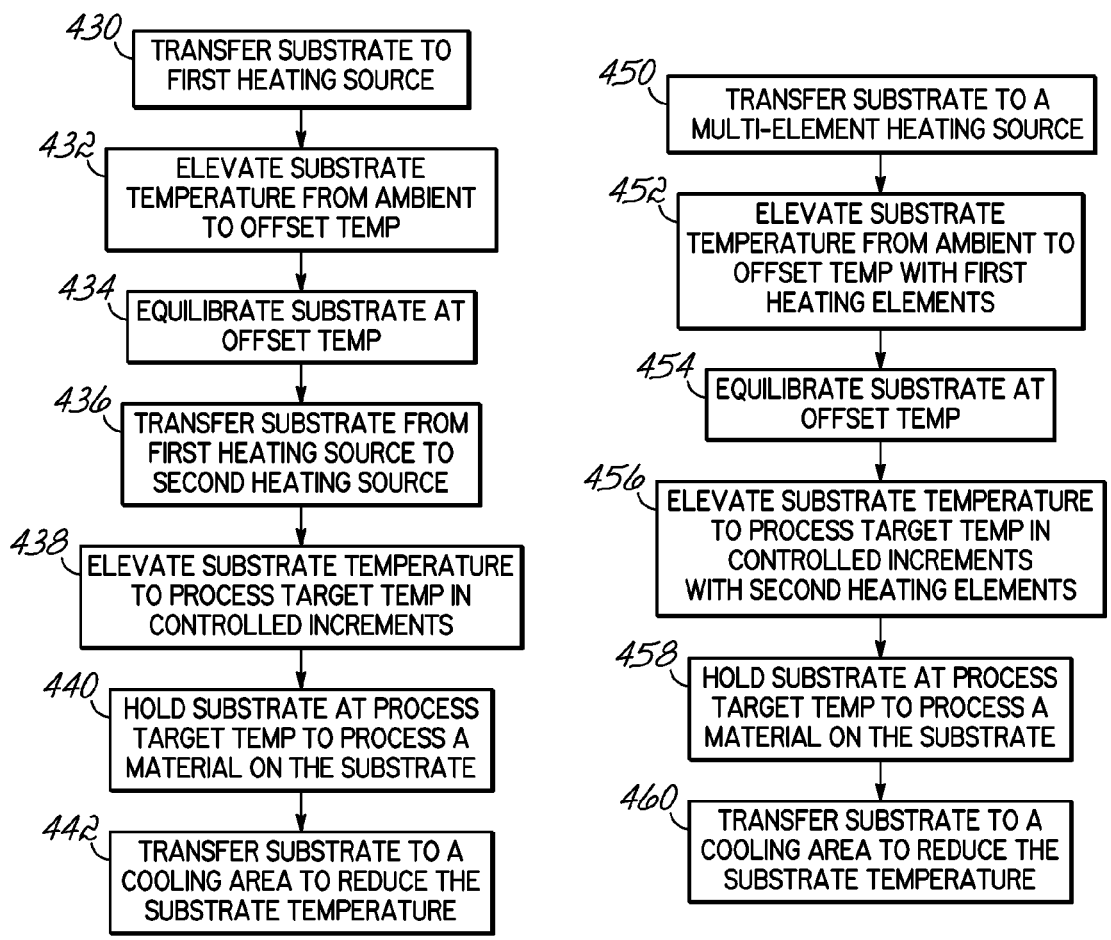
FIG. 13
FIG. 14

METHOD AND HEAT TREATMENT APPARATUS FOR UNIFORMLY HEATING A SUBSTRATE DURING A BAKE PROCESS

FIELD OF THE INVENTION

The invention relates to methods and heat treatment apparatus for thermally processing substrates, such as semiconductor wafers.

BACKGROUND OF THE INVENTION

Photolithography processes for manufacturing semiconductor devices and liquid crystal displays (LCD's) generally coat a resist on a substrate, expose the resist coating to light to impart a latent image pattern, and develop the exposed resist coating to transform the latent image pattern into a final image pattern having masked and unmasked areas. Such a series of processing stages is typically carried out in a coating/developing system having discrete heating sections, such as a pre-baking unit and a post-baking unit. Each heating section of the coating/developing system may incorporate a hot plate with a built-in heater of, for example, a resistance heating type.

Feature sizes of semiconductor device circuits have been scaled to less than 0.1 micron. Typically, the pattern wiring that interconnects individual device circuits is formed with sub-micron line widths. Consequently, the heat treatment temperature of the resist coating should be accurately controlled to provide reproducible and accurate feature sizes and line widths. The substrates or wafers (i.e., objects to be treated) are usually treated or processed under the same recipe (i.e., individual treatment program) in units (i.e., lots) each consisting of, for example, twenty-five wafers. Individual recipes define heat treatment conditions under which pre-baking and post-baking are performed. Wafers belonging to the same lot are heated under the same conditions.

According to each of the recipes, the heat treatment temperature may be varied within such an acceptable range that the temperature will not have an effect on the final semiconductor device. In other words, a desired temperature may differ from a heat treatment temperature in practice. When the wafer is treated with heat beyond the acceptable temperature range, a desired resist coating cannot be obtained. Therefore, to obtain the desired resist coating, a temperature sensor is used for detecting the temperature of the hot plate. On the basis of the detected temperature, the power supply to the heater may be controlled with reliance on feedback from the temperature sensor. However, because the temperature of the entire hot plate is not uniform and varies with the lapsed time, it is difficult to instantaneously determine the temperature of the hot plate using a single temperature sensor.

The post exposure bake (PEB) process is a thermally activated process and serves multiple purposes in photoresist processing. First, the elevated temperature of the bake drives the diffusion of the photoproducts in the resist. A small amount of diffusion may be useful in minimizing the effects of standing waves, which are the periodic variations in exposure dose throughout the depth of the resist coating that result from interference of incident and reflected radiation. Another main purpose of the PEB is to drive an acid-catalyzed reaction that alters polymer solubility in many chemically amplified resists. PEB also plays a role in removing solvent from the wafer surface.

Chemical amplification allows a single photoproduct to cause many solubility-switching reactions, thus increasing the sensitivity of these photoresist systems. Some amount of acid transport is necessary in that it allows a single acid to move to many reactive polymer sites. However, acid transport from nominally exposed to unexposed regions can complicate control of resist feature dimensions. Acid transport through these reactive systems is mechanistically complex. Measurements have shown that there is a very large difference in acid mobility between the starting material, which is reactive towards acid, and the product material, which is no longer reactive.

In addition to the intended results, numerous problems may be observed during heat treatment. For example, the light sensitive component of the resist may decompose at temperatures typically used to remove the solvent, which is a concern for a chemically amplified resist because the remaining solvent content has a strong impact on the diffusion and amplification rates. Also, heat-treating can affect the dissolution properties of the resist and, thus, have direct influence on the developed resist profile.

With the continued shrink of critical dimensions (CD) and allowable critical dimension non-uniformities (CDU) and the continued use of chemically amplified resist (CAR), the post exposure bake (PEB) process contributes to a very large portion of the overall CDU budget. Historically the post exposure bake has been accomplished with a single bake with a thermal profile similar to that of FIG. 1 in which the processing wafer will come into the bake at ambient temperature 50 and go through a ramp up profile 52 to bring it to or very near a requested process temperature 54. Contemporary processes may go from an ambient temperature of about 23° C. to a process temperature of about 100-130° C. The final target temperature depends on resist chemistry. The bake profile would then have a stage 56 during the baking process that was basically thermally stable, typically referred to as steady state, until the overall requested processing time was complete at which time the wafer would be exchanged to a cooling arm or cool plate and the wafer would experience a rapid thermal ramp down 58 back to or near ambient temperature. Because the baking process is being applied over a large wafer area, a large thermal gradient, and partially because hot plates are generally multi-zoned, with multiple heating elements and with individual sensors and controllers for each zone, there is an inherent across wafer thermal variation associated with the bake process. With contemporary hot plate zone control schemes, the speed at which the thermal ramp 52 is attempted directly relates to the peak magnitude of variation, the broadness of the variation distribution, and also the total integrated area of variation. The choice of ramp up condition therefore becomes a balance of applying enough thermal energy to exhaust the chemically-amplified reaction without having a thermal variation profile through time that generates a high hot plate induced CD non-uniformity.

In the above application, the hot plate controller(s) tries to keep the variation experienced at each moment in time, through ramp up and steady state, to a minimum on the hot plate. There is an assumption that all hot plate variation through time is equivalent or at least that all hot plate variation through time above the activation energy of the chemically activated resist is equivalent. In reality, since chemically amplified resist reaction rates adhere to an Arrhenius relationship described by the equation below and as seen in the graph in FIG. 2, $$\ln(k) = \frac{-E_a}{R}\frac{1}{T} + \ln(A)$$

in which the reaction rate increases exponentially with temperature above the activation energy, the variation experienced, for example, at a target temperature minus 10° C. is not equivalent to a variation experienced at the target temperature minus 3° C.

What is needed therefore is an apparatus and associated method for the post exposure bake that minimizes CD non-uniformity due to hot plate variation.

SUMMARY OF THE INVENTION

Embodiments of the invention provide a heat treatment apparatus for heating a substrate. The heat treatment apparatus includes a processing chamber containing a process space, a first and second substrate support in the process space, and a first and second heating source. The first substrate support is configured to support the substrate in a spaced relationship with the first heating source to define a first heat exchange gap between the first heating source and the substrate. The first heating source transfers heat energy through the first heat exchange gap to elevate a temperature of the substrate to an offset temperature below a process target temperature. The second substrate support is configured to support the substrate in a spaced relationship with the second heating source to define a second heat exchange gap between the second heating source and the substrate. The second heating source transfers heat energy through the second heat exchange gap to elevate the temperature of the substrate from the offset temperature below to the process target temperature in controlled increments.

In some embodiments, the processing chamber includes a first processing chamber containing a first process space and a second processing chamber containing a second process space. The first heat exchange gap and the first heating source are contained within the first process space and the second heat exchange gap and the second heating source are contained within the second process space. Within some of these embodiments, the first substrate support is located in the first processing space forming the first heat exchange gap and the second substrate support is located in the second processing space forming the second heat exchange gap. For these embodiments, the heat treatment apparatus may further include a transport device that transfers the substrate from the first substrate support to the second substrate support after the temperature of the substrate is elevated to the offset temperature.

In other embodiments, the first substrate support forming the first heat exchange gap and the second substrate support forming the second heat exchange gap are located within a single process space. For these embodiments, the heat treatment apparatus may further include a transport device configured to transfer the substrate from the first substrate support to the second substrate support after the temperature of the substrate is elevated to the offset temperature. The first and second heating sources for the above embodiments may include a hot plate.

In one embodiment, the heat treatment apparatus includes a processing chamber containing a process space, a substrate support in the process space, and a heating source. The substrate support is configured to support the substrate in a spaced relationship with the heating source to define a heat exchange gap between the heating source and the substrate. The heating source transfers heat energy through the heat exchange gap to rapidly elevate a temperature of the substrate to an offset temperature below a process target temperature, and further transfers heat energy through the heat exchange gap to elevate the temperature of the substrate from the offset temperature to the process target temperature in controlled increments.

Further embodiments of the invention provide a method for heating the substrate inside the processing chamber. The substrate is supported in a spaced relationship with a first substrate support inside the processing chamber with the substrate separated from a first heating source by a first heat exchange gap. Heat energy is transferred from the first heating source through the first heat exchange gap and to the substrate for use in heating the substrate to an offset temperature below a process target temperature. The substrate is held at the offset temperature to equilibrate a temperature of the substrate. The substrate is then supported in a spaced relationship with the second substrate support inside the processing chamber with the substrate separated from a second heating source by a second heat exchange gap. Heat energy is then transferred from the second heating source through the second heat exchange gap and to the substrate for use in heating the substrate to the process target temperature in controlled increments.

In some embodiments where the substrate support includes a first substrate support forming the first heat exchange gap and a second substrate support forming the second heat exchange gap, the substrate is moved from the first substrate support to the second substrate support after the substrate has been heated to the offset temperature. Within some of these embodiments where the processing chamber includes a first processing chamber containing the first substrate support and a second processing chamber containing the second substrate support, the substrate is moved from the first substrate support in the first processing chamber to the second substrate support in the second processing chamber after the substrate has been heated to the offset temperature.

In some embodiments the substrate has a top surface and a bottom surface, the substrate is supported in a spaced relationship with the substrate support inside the processing chamber with the top surface of the substrate separated from the first heating source by the first heat exchange gap. The substrate may also be supported in a spaced relationship with the substrate support inside the processing chamber with the bottom surface of the substrate separated from the second heating source by the second heat exchange gap.

In one embodiment for heating a substrate inside a processing chamber, where the substrate has a bottom surface, the substrate is supported in a spaced relationship with a substrate support inside the processing chamber with the bottom surface of the substrate separated from a heating source by a heat exchange gap. Heat energy is transferred from the heating source through the heat exchange gap and to the bottom surface of the substrate for use in rapidly heating the substrate to a offset temperature below a process target temperature. Additional heat energy is then transferred from the heating source through the heat exchange gap and to the bottom surface of the substrate for use in heating the substrate to the process target temperature in controlled increments.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

FIG. 9A is a top view of another embodiment for a hot plate configuration to perform a dual-stage bake.

FIG. 9B is a cross sectional view of the embodiment in FIG. 9A through line 9B.

FIG. 12 is a graph showing the general temperature profile during processing of a substrate using a dual-stage bake process.

FIG. 13 is a flowchart showing the process for the dual-stage bake consistent with the embodiments in FIGS. 8A-10B.

FIG. 14 is a flowchart showing the process for the dual-stage bake consistent with the embodiment in FIGS. 11A and 11B.

DETAILED DESCRIPTION

Figure 1:
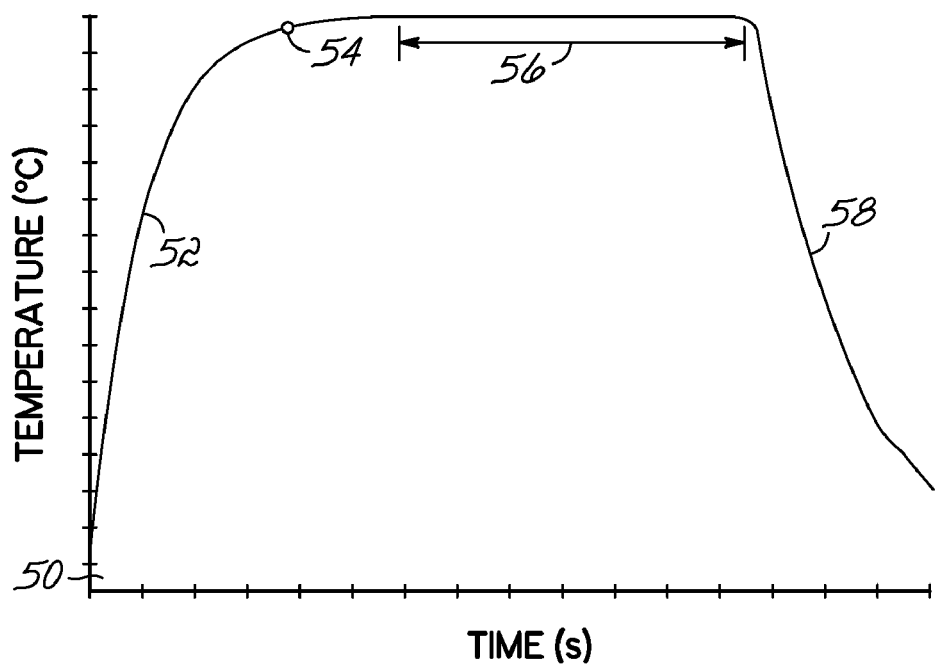
FIG. 1 is a graph of a typical historical PEB thermal profile.
Figure 2:
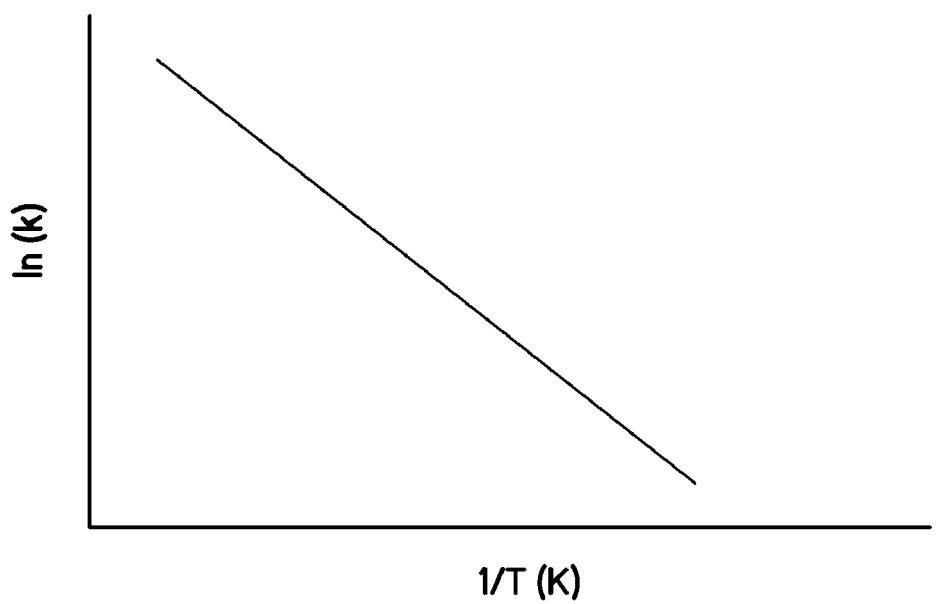
FIG. 2 is a graph of an Arrhenius plot showing the relationship between temperature and reaction rate.
Figure 3:
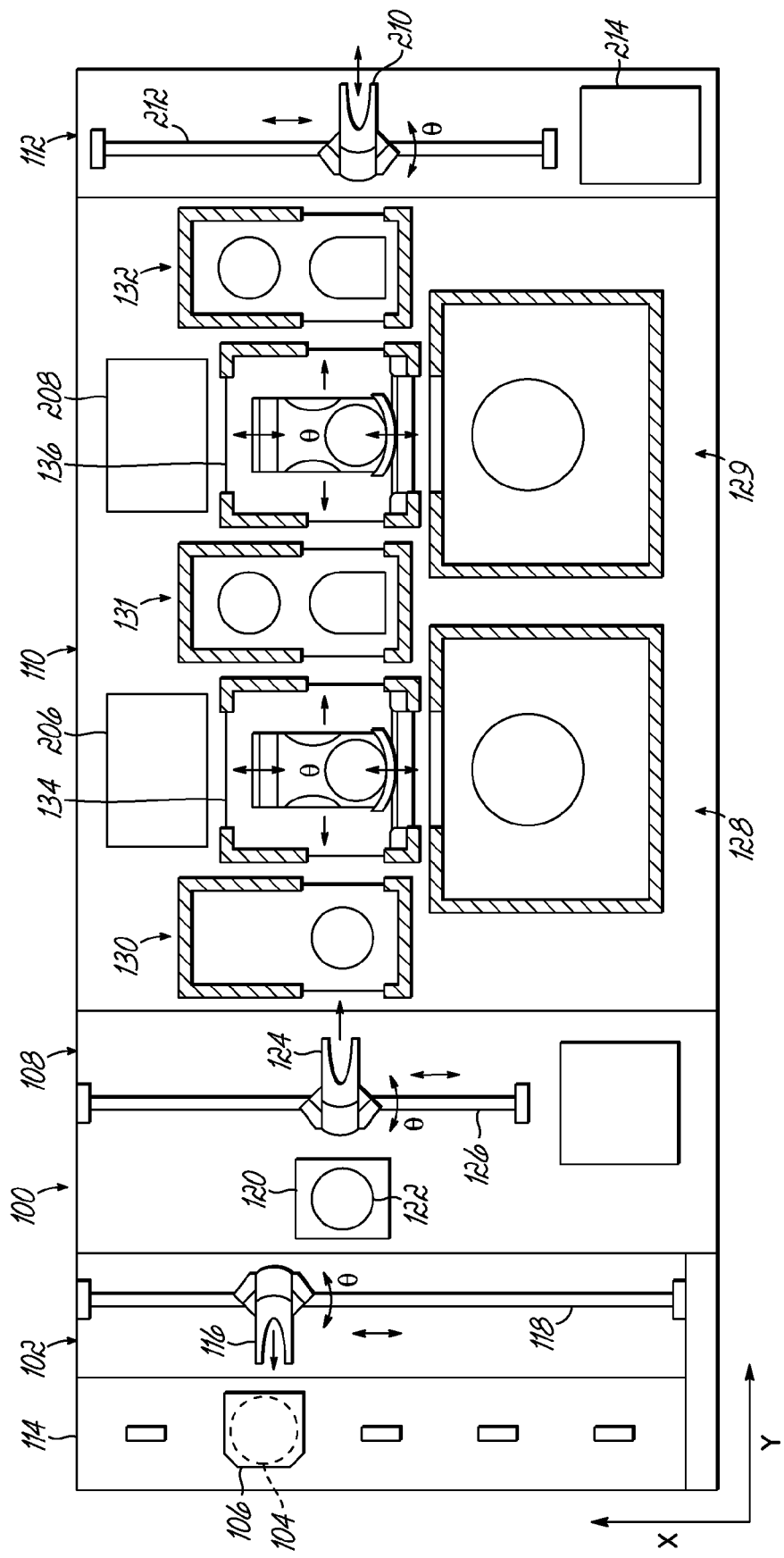
FIG. 3 is a plan view showing the general structure of a coating/developing system used to process substrates in accordance with an embodiment of the invention.

An exemplary coating/developing system 100, as shown in FIG. 3, may be constituted to integrally connect a cassette station 102, which transports a cassette typically holding 25 substrates, such as semiconductor wafers 104, for example, into the coating/developing system 100 from outside and which transports a wafer 104 to the cassette 106; an inspection station 108, which performs a predetermined inspection on the wafer 104; a processing station 110 with a plurality of types of processing devices disposed in stages to perform predetermined processes in a layered manner in the photolithography step; and an interface unit 112, provided adjacent to the processing station 110, for delivering the wafer 104 to an exposure device (not shown).

A cassette support stand 114 is provided at the cassette station 102; the cassette support stand 114 may freely carry a plurality of cassettes 106 in a row in the X direction (vertically, in FIG. 3). The cassette station 102 is provided with a wafer transporter 116 able to move on the transport path 118 in the X direction. The wafer transporter 116 may also move freely in the wafer array direction (Z direction; perpendicular) of the wafers 104 housed in the cassette 106 and can selectively access the wafer 104 vertically arrayed in the cassette 106. The wafer transporter 116 may rotate around an axis (θ direction) in the particular direction, and may also access the inspection station's transfer unit 120.

Disposed at the cassette station 102 side of inspection station 108 is the transfer unit 120 for transferring the wafer 104 from the cassette station 102. A carrying unit 122 for carrying the wafer 104 may be provided in the transfer unit 120. A wafer transporter 124 able to move on a transport path 126 in the X direction may be provided at the positive X direction side (upward in FIG. 3) of the inspection station 108. The wafer transporter 124 also may move vertically and rotate freely in the θ direction, and may also access the transfer unit 120 and each processing device in a processing device group 130 at the processing station 110 side.

A processing station 110 adjacent to the inspection station 108 is provided with a plurality of processing devices disposed in stages, such as five processing device groups 128-132. The first processing device group 128 and the second processing device group 129 are disposed in sequence from the inspection station 108 side, at the negative X direction side (downward in FIG. 3) of the processing station 110. The third processing device group 130, fourth processing device group 131, and fifth processing device group 132 are disposed in sequence from the inspection station 108 side, at the positive X direction side (upward in FIG. 3) of the processing station 110. A first transport device 134 is provided between the third processing device group 130 and the fourth processing device group 131. The transport device 134 may transport the wafer 104 to access each device in the first processing device group 128, third processing device group 130, and fourth processing device group 131. A second transport device 136 transports the wafer 104 and selectively accesses the second processing device group 129, fourth processing device group 131, and fifth processing device group, 132.

Figure 4:
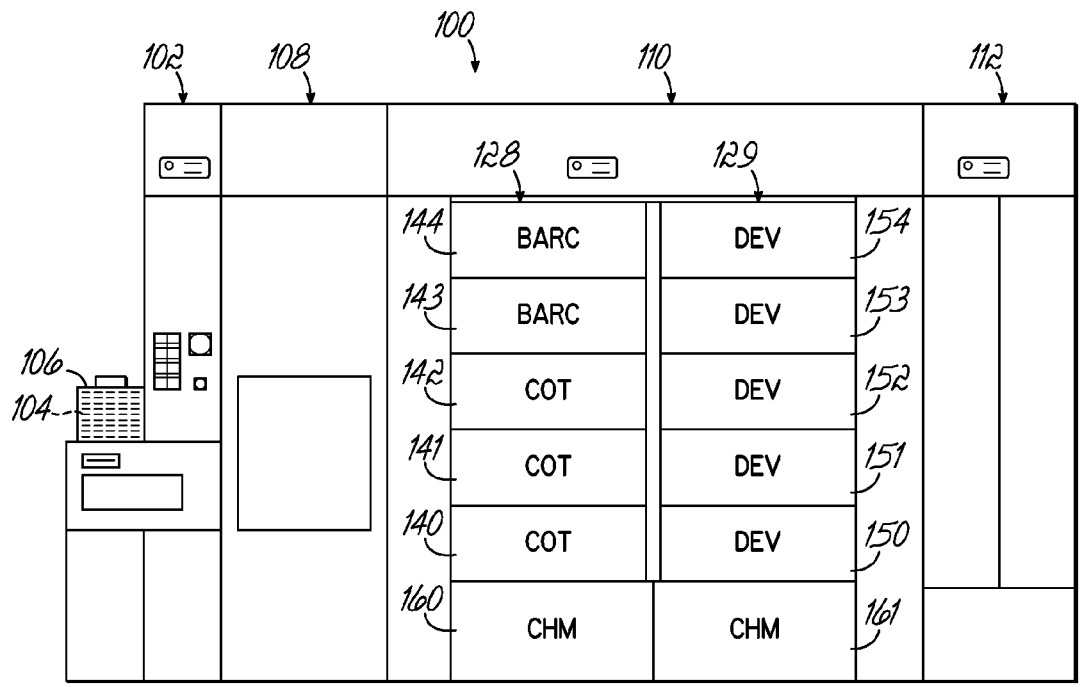
FIG. 4 is a front view of the coating/developing system in FIG. 3.

With further reference to FIG. 4, the first processing device group 128 stacks liquid processing devices that supply a predetermined liquid spin-on material to the wafer 104 and process it. Devices such as spin coating devices 140, 141, and 142, which may apply a resist solution to the wafer 104 and form a resist film, and bottom coating devices 143 and 144, which form an anti-reflection film that prevents light reflection during exposure processing, may be arranged in five levels in sequence from the bottom. The second processing device group 129 stacks liquid processing devices such as developing devices 150-154, which supply developing fluid to the wafer 104 and develop it, in five levels in sequence from the bottom. Also, terminal chambers 160 and 161 are provided at the lowest stages of the first processing device group 128 and the second processing device group 129 in order to supply processing liquids to the liquid processing devices in the processing device groups 128 and 129.

Figure 5:
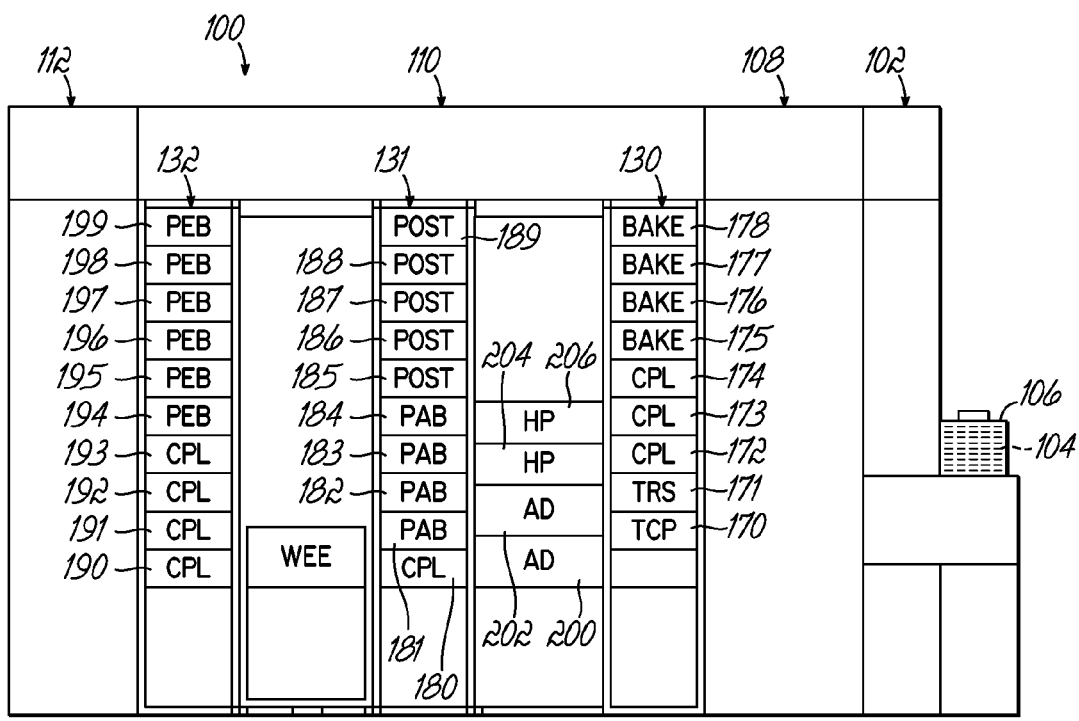
FIG. 5 is a rear view of the coating/developing system in FIG. 3.

Also, as shown in FIG. 5, for example, the third processing device group 130 stacks temperature regulation device 170, transition device 171 for transfer of the wafer 104, high precision temperature regulation devices 172-174, which regulate the temperature of the wafer 104 under high precision temperature management, and high temperature heating devices 175-178, which heat the wafer 104 to high temperature, in nine levels in sequence from the bottom.

The fourth processing device group 131 stacks a high precision temperature regulation device 180, pre-baking devices 181-184 for heating the wafer 104 after resist coating processing, and post-baking devices 185-189, which heat the wafer 104 after developing, in ten levels in sequence from the bottom. Each of the pre-baking devices 181-184 and post-baking devices 185-189 includes at least one hot plate (not shown) for elevating the temperature of the wafer 104 and the layer on the wafer 104.

The fifth processing device group 132 stacks a plurality of heating devices that heat the wafer W, such as high precision temperature regulation devices 190-193, and post-exposure baking devices 194-199 in ten levels in sequence from the bottom.

A plurality of processing devices may be disposed at the positive X direction side of the first transport device 134 as shown in FIG. 3. Adhesion devices 200 and 202 for making the wafer 104 hydrophobic and heating devices 204 and 206 for heating the wafer 104 are stacked in four levels in sequence from the bottom, as shown in FIG. 5, for example. A peripheral exposure device 208 for selectively exposing only the edge of the wafer 104 may be disposed at the positive X direction side of the second transport device 136 as shown in FIG. 3.

Provided in the interface unit 112 are a wafer transporter 210 that moves on a transport path 212 extending in the X direction as shown in FIG. 3 and a buffer cassette 214. The wafer transporter 210 can move in the Z direction and can rotate in the θ direction; and can transport the wafer 104 and access the exposure device (not shown) adjacent to the interface unit 112 and the buffer cassette 214 and the fifth processing device group 132.

Figure 6:
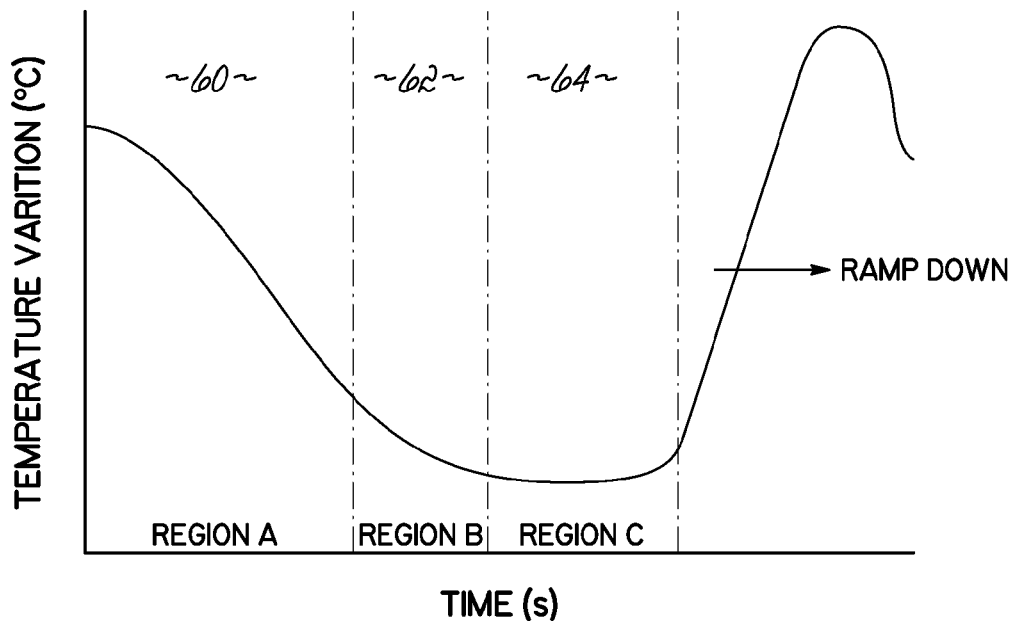
FIG. 6 is a graph of a typical historical PEB thermal variation profile through the each region defining ramp up, steady state, and ramp down.
Figure 7:
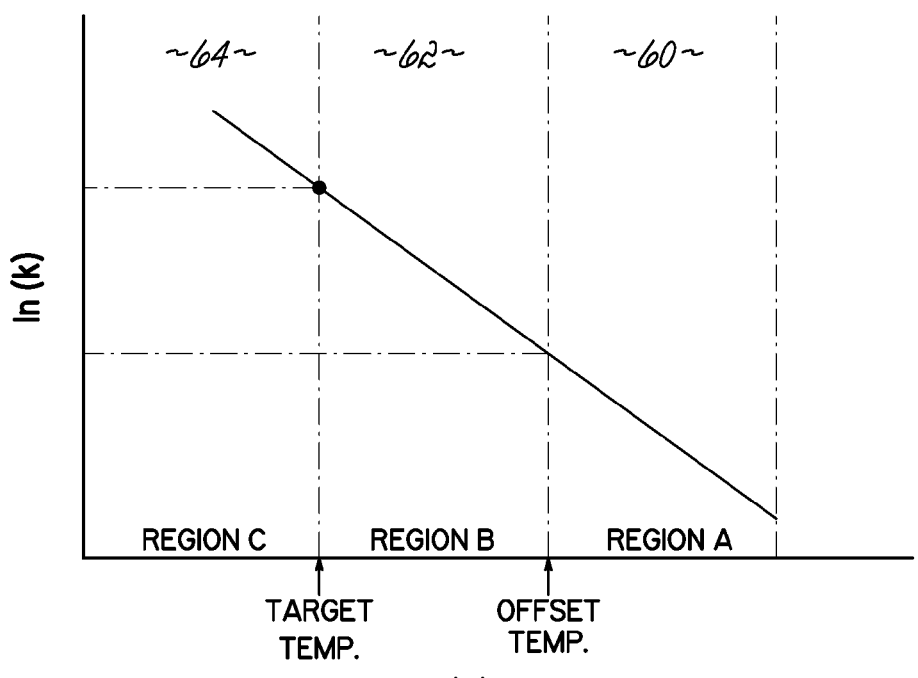
FIG. 7 is a graph showing the merger of the variation profile with the Arrhenius plot to illustrate where the variation in the thermal profile is significant.

It was found in simulation using an experimentally calibrated resist that by adding variation into the thermal hot plate profile incrementally that a critical dimension non-uniformity (CDU) critical region was evident regardless of different ramp up profiles used, e.g. slow, standard, or fast. Based on these simulation results, three observations were made. First, temperature variation through time prior to CDU critical transition region is somewhat insignificant. This variation is being experienced either below the thermal activation energy of the resist or the reaction rate dictated by the Arrhenius relationship for chemically amplified resist is insignificant (Region A 60 in FIGS. 6 and 7). Second, the temperature variation through time during the CDU critical transition region (offset temperature to target temperature) is significant. This variation is being experienced in a region of significant reaction rate as dictated by the Arrhenius relationship for chemically amplified resist, at least up to the point where the chemical reaction is potentially exhausted (Region B 62 in FIGS. 6 and 7). And third, temperature variation through time after the CDU critical transition region appears somewhat insignificant. Although this variation is being experienced in a high reaction rate region as dictated by the Arrhenius relationship for chemically amplified resist, it appears that the chemical reaction is exhausted or that there is a time averaging effect contributing to low additional critical dimension nonuniformity induced by the thermal variation experienced in steady state (Region C 64 in FIGS. 6 and 7).

With these observations, embodiments of the invention assist in reducing the hot plate variation experienced through a CDU temperature critical region by using a dual-stage bake process. The dual-stage bake may reduce the amount of CD non-uniformity attributable to the PEB process thermal variation through time, particularly for resists with average or above average static PEB sensitivity, a measure of change in CD associated with change in steady state PEB temperature (Region C 64 in FIGS. 6 and 7). Currently, static PEB sensitivity ranges from approximately 1-5 nm/° C. for typical 192 nm resists.

Figure 8A:
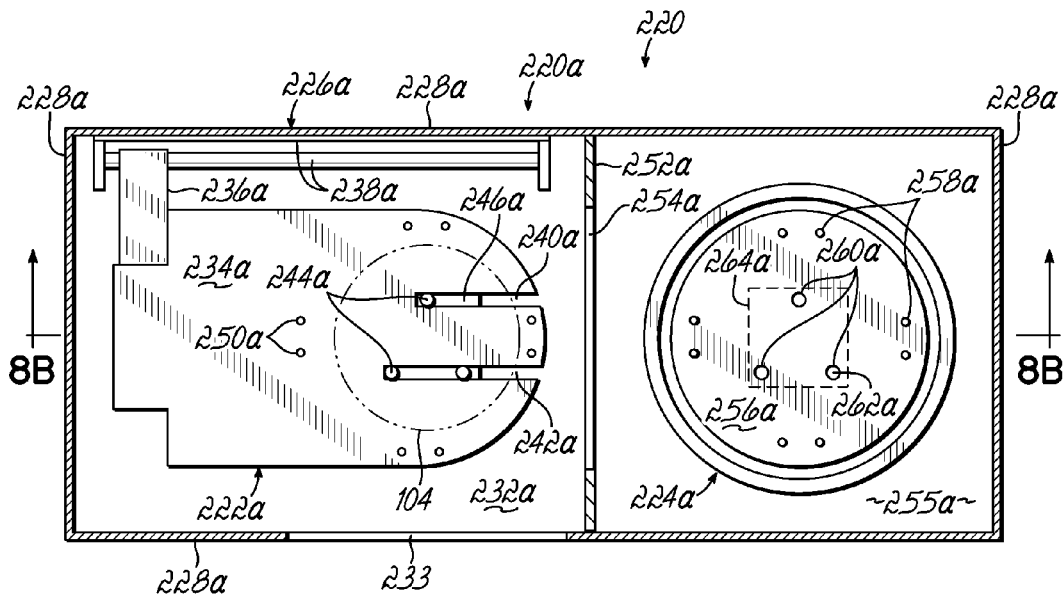
FIG. 8A is a top view of an embodiment for a hot plate configuration to perform a dual-stage bake.
Figure 8B:
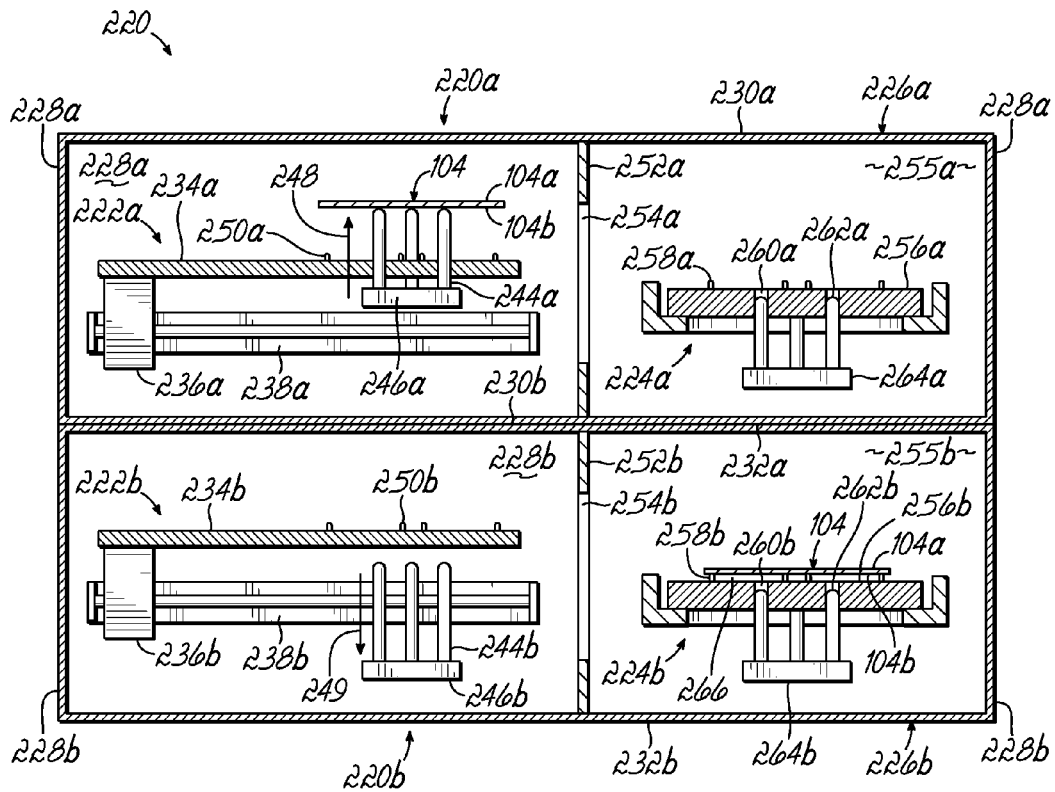
FIG. 8B is a cross sectional view of the embodiment in FIG. 8A through line 8B.

One embodiment of the dual-stage bake may be implemented using a pair of conventional PEB modules, referred to as sub-modules. For example and with reference to FIG. 8A and FIG. 8B, a PEB module 220 may include two sub-modules 220a, 220b, each having a cool plate 222a, 222b and a heating source such as a hot plate 224a, 224b. Each sub-module 220a, 220b in the PEB module 220 is surrounded by a processing chamber 226a, 226b, which includes sidewalls 228a, 228b, top walls 230a, 230b and bottom walls 232a, 232b as best seen in FIG. 8B. An opening 233 through sidewall 228a, for example, permits access to the interior of each of the sub-modules 220a, 220b in the PEB module 220.

The cool plate 222a, 222b includes a support surface 234a, 234b supported by an arm 236a, 236b that moves along a guide support 238a, 238b. The support surface 234a, 234b includes slots 240 and 242 (as best seen in FIG. 8A), which align with support posts 244a, 244b. These support posts 244a, 244b extend from a common base 246a, 246b, which is adapted to raise and lower the posts 244a, 244b relative to support surface 234a, 234b as shown by arrows 248 and 249. Support surface 234a, 234b includes a plurality of pins 250a, 250b adapted to support the semiconductor wafer 104 having a top surface 104a and bottom surface 104b. The wafer 104 may be supported from its bottom surface 104b so that the bottom surface 104b of the wafer 104 does not contact the support surface 234a, 234b.

As shown in FIGS. 8A and 8B, the sub-module 220a, 220b includes a central wall 252a, 252b between the cool plate 222a, 222b and the hot plate 224a, 224b. An opening 254a, 254b allows the wafer 104 to be transferred from the cool plate 222a, 222b to the hot plate 224a, 224b, which is positioned in a process space 255a, 255b.

The hot plate 224a, 224b includes a surface 256a, 256b and a plurality of support pins 258a, 258b along with three holes 260a, 260b aligned with three posts 262a, 262b, which are supported on a common base 264a, 264b. Base 264a, 264b is designed to raise and lower the posts 262a, 262b in a similar fashion to the posts 244a, 244b and base 246a, 246b. The support pins 258a, 258b support the bottom surface 104b of the wafer 104 above the hot plate surface 256a, 256b forming a heat exchange gap 266.

As set forth above, the conventional PEB setup may be utilized for the dual-stage bake by using two standard PEB sub-modules 220a and 220b in proximity to one another. One sub-module, 220b for this embodiment, may be set to elevate the temperature of the wafer 104 to a desired offset temperature, which corresponds to the process target temperature minus some temperature value. The other sub-module, 220a for this embodiment, may be set at the process target temperature. In other embodiments employing this implementation, the order of the sub-modules 220a and 220b may be reversed.

The first hot plate 224b would be responsible for ramping the wafer 104 from ambient to the desired offset temperature and then allowed to equilibrate. The ramp up may be set for the fastest possible increase, since variation during this region is not of significant concern (Region A 60 in FIG. 7). The second hot plate 224a would then heat the wafer the rest of the way to the process target temperature in a very controlled, small temperature delta ramp up. The second transport device 136 would transfer the heated wafer 104 from the first hot plate 224b to the second hot plate 224a by picking up the wafer 104 from the support surface 234b and delivering it to the support surface 234a, where it would be internally transferred to hot plate 224a. This embodiment may introduce an additional temperature variation by the main arm transfer, due to the transfer time and heat loss from wafer 104 during transfer. While this variation should not induce significant changes to CDU on its own, it may hinder the ability of the second hot plate 224a to progress through a controlled final ramp up, which may lead to additional induced CD non-uniformities.

In an alternative embodiment, the dual-stage bake may be implemented using a single modified PEB module. For example and with reference with FIG. 9A and FIG. 9B, a PEB module 270 may include a cool plate 272 and two heating sources such as hot plates 274 and 275. The PEB module 270 is surrounded by a processing chamber 276, which includes sidewalls 278 and top and bottom walls 280 and 282, respectively. An opening 283 through sidewall 278 permits access to the interior of PEB module 270.

The cool plate 272 includes a support surface 284 supported by an arm 286, which moves along a guide support 288. The support surface 284 includes slots 290 and 292, which align with support posts 294. These support posts 294 extend from a common base 296, which is adapted to raise and lower the posts 294 relative to support surface 284 as shown by the arrow 298. Support surface 284 includes a plurality of pins 300 adapted to support the semiconductor wafer 104 from its bottom surface 104b so that the bottom surface 104b of the wafer 104 does not contact the support surface 284.

As shown in FIGS. 9A and 9B, the PEB module 270 includes a central wall 302 between the cool plate 272 and the hot plates 274, 275. An opening 304 allows the wafer 104 to be transferred from the cool plate 272 to the first hot plate 274, which is positioned with the second hot plate 275 in a process space 305. A further wall (not shown) with opening may be installed also between hot plates 274 and 275.

Both hot plates 274, 275 include a surface 306, 307 and a plurality of support pins 308, 309 along with three holes 310, 311 aligned with three posts 312, 313, which are supported on a common base 314, 315. Bases 314, 315 are designed to raise and lower the posts 312, 313 in a similar fashion to the posts 294 and base 296. Support pins 308, 309 support the bottom surface 104b of the wafer 104 above the hot plate surfaces 306, 307 forming heat exchange gaps 316 and 317, respectively.

The first hot plate, 274 for this embodiment, is set to elevate the temperature of wafer 104 to the desired offset temperature. The second hot plate, 275 for this embodiment, is set at the process target temperature. In other embodiments employing this implementation, the order of the hot plates 274 and 275 may be reversed. The first hot plate 274 would be responsible for ramping the wafer 104 from ambient to the desired offset temperature and then allow the wafer 104 to equilibrate. The ramp up may be set for the fastest possible increase, since variation during this region is not of significant concern (Region A 60 in FIG. 7). The second hot plate 275 would then heat the wafer the rest of the way to the process target temperature in a very controlled small temperature delta ramp up. Internal to the PEB module 270, there would be a transfer system to take the heated wafer from the first hot plate 274 to the second plate 275 in a very quick exchange. The current internal transfer mechanism including support surface 284, arm 286, and guide support 288, may be modified to accomplish the transfer. In other embodiments a second transfer mechanism may be used. Because of the dual hot plates 274, 275, the effect to overall cell footprint would be increased, while still maintaining a cooling stage for use after the second hot plate 275 process is complete.

Another alternative embodiment for the dual-stage bake may be implemented using a single modified PEB module, but having a footprint closer to a conventional PEB module. For example and with reference to FIGS. 10A, 10B and 10C, a PEB module 320 may include a cool plate 322 and a heating source such as hot plates 324, 325. The PEB module 320 is surrounded by a processing chamber 326, which includes sidewalls 328 and top and bottom walls 330 and 332, respectively. An opening 333 through sidewall 328 permits access to the interior of PEB module 320.

The cool plate 322 includes a support surface 334 supported by an arm 336, which moves along a guide support 338. The support surface 334 includes slots 340 and 342, which align with support posts 344. These support posts 344 extend from a common base 346, which is adapted to raise and lower the posts 344 relative to support surface 334 as shown by the arrow 348. Support surface 334 includes a plurality of pins 350 adapted to support the semiconductor wafer 104 from its bottom surface 104b so that the bottom surface 104b of the wafer 104 does not contact the support surface 334.

Figure 10A:
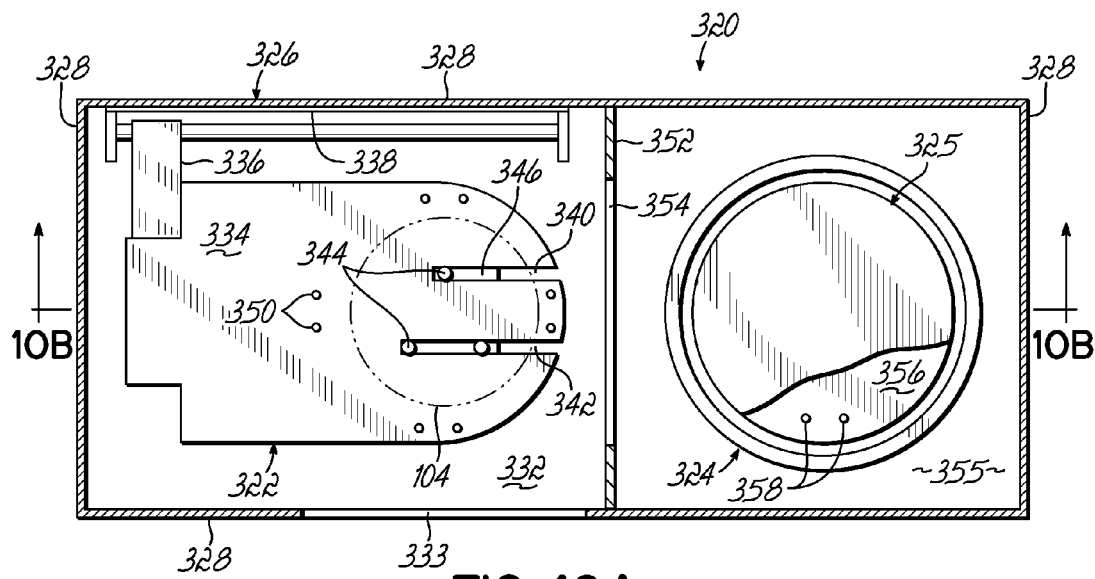
FIG. 10A is a top view of still another embodiment for a hot plate configuration to perform a dual-stage bake.
Figure 10B:
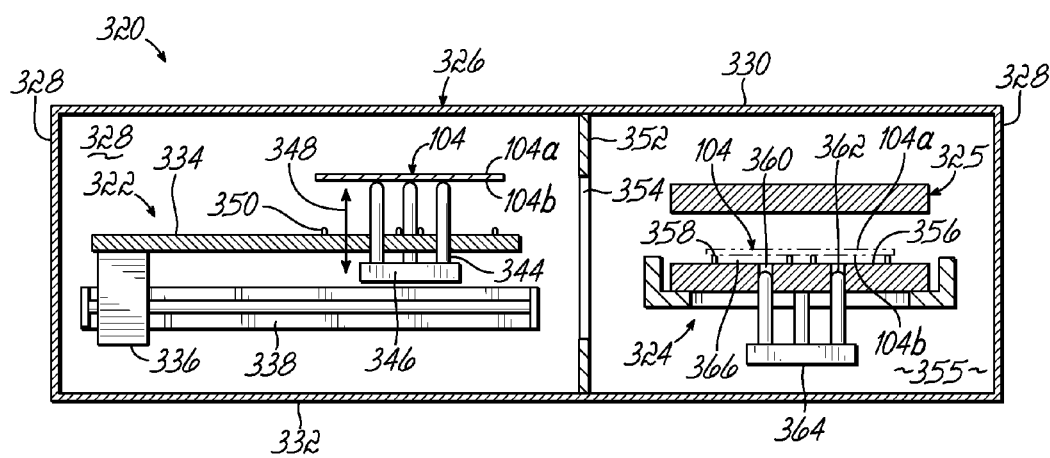
FIG. 10B is a cross sectional view of the embodiment in FIG. 10A through line 10B.
Figure 10C:
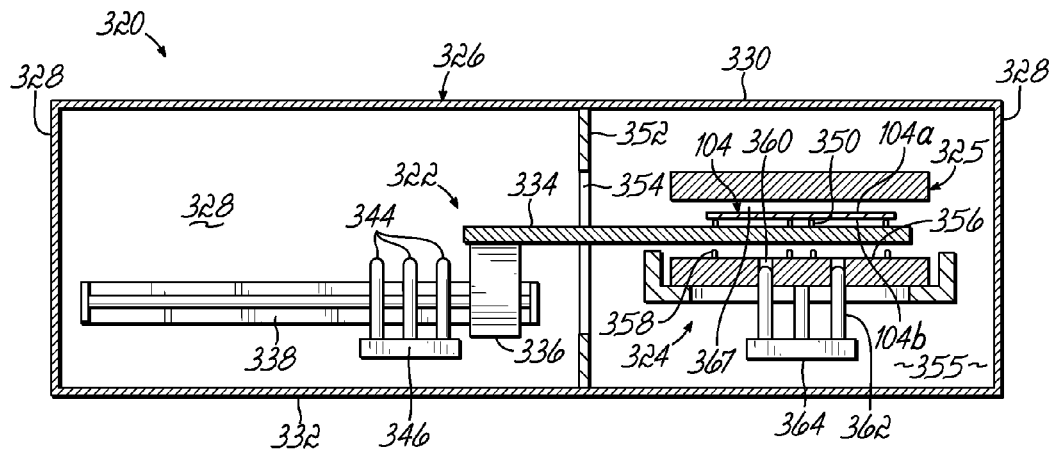
FIG. 10C is another cross sectional view similar to FIG. 10B of the embodiment in FIG. 10A.

As shown in FIGS. 10A, 10B and 10C, the PEB module 320 includes a central wall 352 between the cool plate 322 and the hot plates 324, 325. An opening 354 allows the wafer 104 to be transferred from the cool plate 322 and be positioned under the first hot plate 325, which is positioned with the second hot plate 324 in a process space 355. The cool plate 322 may be used to position the wafer 104 under the first hot plate 325 forming a first heat exchange gap 367 between the first hot plate 325 and a top surface 104a of the wafer 104, as shown in FIG. 10C. The first hot plate 325 is set to elevate the temperature of wafer 104 to the desired offset temperature. The first hot plate 325 would be responsible for ramping the wafer 104 from ambient to the desired offset temperature and then allow the wafer 104 to equilibrate. The ramp up may be set for the fastest possible increase, since temperature variation during this region is not of significant concern (Region A 60 in FIG. 7).

The second hot plate 324 includes a surface 356 and a plurality of support pins 358 along with three holes 360 aligned with three posts 362, which are supported on a common base 364. The base 364 is designed to raise and lower the posts 362 in a similar fashion to the posts 344 and base 346. Support pins 358 support the bottom surface 104b of the wafer 104 above the second hot plate 324 surface 356 forming a heat exchange gap 366, as shown in FIG. 10B.

The second hot plate 324 is set at the process target temperature. After the first hot plate 325 raises and equilibrates the temperature of the wafer to the offset temperature, the wafer 104 is transferred quickly to the second hot plate 324. The second hot plate 324 would then heat the wafer 104 the rest of the way to the process target temperature in a very controlled small temperature delta ramp up. The current internal transfer mechanism including the support surface 334, arm 336, and guide support 338 may be utilized for both the wafer support for the first hot plate 325 as well as function as the cool plate 322 after the wafer 104 has been processed by the second hot plate 324. Alternatively, the roles of hot plates 324 and 325 may be exchanged, e.g. hot plate 325 may be set at the process target temperatures, while hot plate 324 may be set at the offset temperature.

In yet another alternate embodiment, the dual-stage bake may be implemented using a single conventional PEB module with a modified hot plate. For example and with reference with FIGS. 11A and 11B, a PEB module 370 may include a cool plate 372 and a heating source such as a hot plate 374. The PEB module 370 is surrounded by a processing chamber 376, which includes sidewalls 378 and top and bottom walls 380 and 382 respectively. An opening 383 through sidewall 378 permits access to the interior of PEB module 370.

The cool plate 372 includes a support surface 384 supported by an arm 386 which moves along a guide support 388.

The support surface 384 includes slots 390 and 392, which align with support posts 394. These support posts 394 extend from a common base 396, which is adapted to raise and lower the posts 394 relative to support surface 384 as shown by arrow 398. Support surface 384 includes a plurality of pins 400 adapted to support the semiconductor wafer 104 from its bottom surface 104b so that the bottom surface 104b of the wafer 104 does not contact the support surface 384.

Figure 11A:
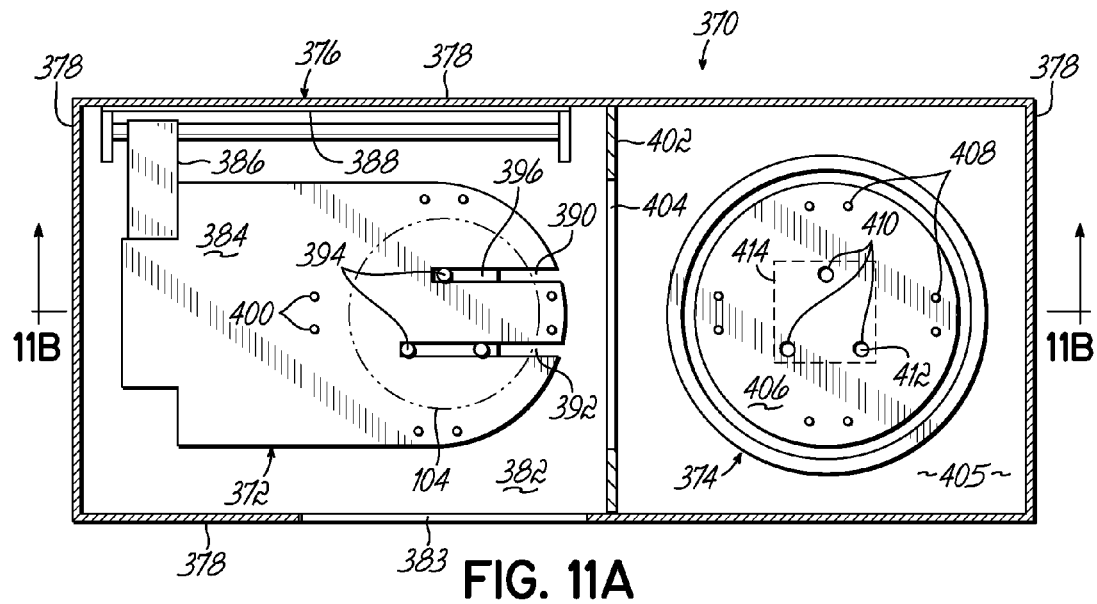
FIG. 11A is a top view of an alternate embodiment for a hot plate configuration to perform a dual-stage bake.
Figure 11B:
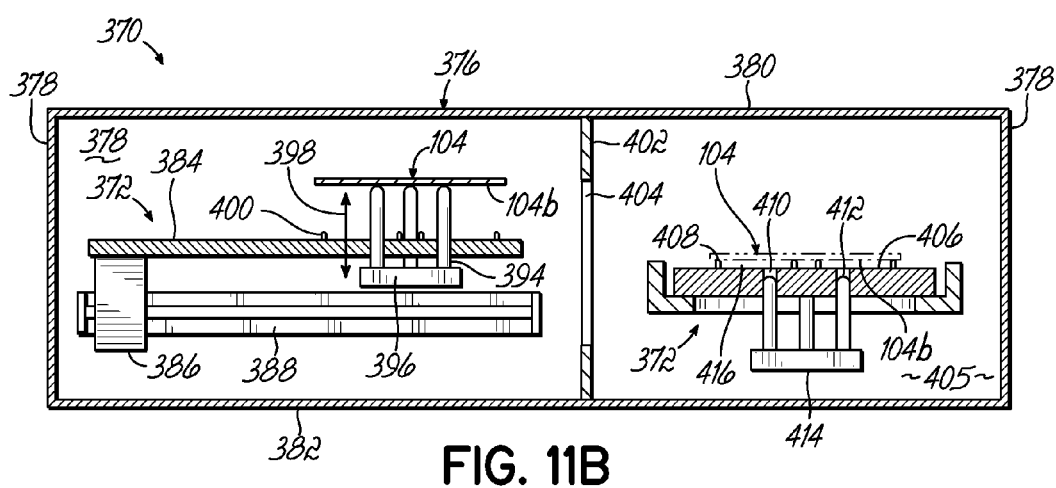
FIG. 11B is a cross sectional view of the embodiment in FIG. 11A through line 11B.

As shown in FIGS. 11A and 11B, the PEB module 370 includes a central wall 402 between the cool plate 372 and the hot plate 374. An opening 404 allows the wafer 104 to be transferred from the cool plate 372 to the hot plate 374, which is positioned in a process space 405.

The hot plate 374 includes a surface 406 and a plurality of support pins 408 along with three holes 410 aligned with three posts 412, which are supported on a common base 414. Base 414 is designed to raise and lower the posts 412 in a similar fashion to the posts 394 and base 396. The support pins 408 support the bottom surface 104b of the wafer 104 above the hot plate surface 406 forming a heat exchange gap 416.

The single hot plate 374 may be configured with multiple heating elements that can operate through a spike in temperature as well as controlled gradual increments to allow for dual temperature targets in the same overall thermal process. These heating elements may be implemented as rings or as segments, for example, as is known with conventional hot plates. The hot plate 374 would first ramp up the wafer 104 from ambient to the desired offset temperature with a subset of the heating elements that allow for rapid changes and then be allowed to equilibrate. The ramp up may be set for the fastest possible increase, since variation during this region is not of significant concern (Region A 60 in FIG. 7). A controller for this ramp up may be configured to keep the heating element temperature profile similar to the profile of the wafer 104. Additional heating elements on the hot plate 374 would then heat the wafer 104 the rest of the way to the process target temperature in a very controlled small temperature delta ramp up.

In an alternate configuration of PEB module 370, the pins 408, which support the wafer 104 above the hot plate 374 may be moveable in order to vary the gap 416 between the wafer 104 and the hotplate 374. In this alternate configuration, the wafer 104 is transferred to the support pins 408 forming the heat exchange gap 416 between the bottom surface of the wafer 104b and the hot plate surface 406. The hot plate 374 may be configured to operate through a spike in temperature as well as controlled gradual increments, as above, to allow for dual temperature targets in the same overall thermal process. Initially, the support pins 408 would be set such that the heat exchange gap 416 would be small to assist in rapid heating. The hot plate 374 would quickly ramp up the temperature of the wafer 104 from ambient to the desired offset temperature through the small gap 416 and then be allowed to equilibrate as above. After the temperature of the wafer 104 has settled at the offset temperature, the support pins 408 may raise the wafer 104 above the hot plate surface 406 to create a larger gap 416 for the slower, more controlled heating. The hot plate 374 would then heat the wafer 104 the rest of the way to the process target temperature in a very controlled small temperature delta ramp up as above.

In each of the embodiments for the dual-stage bake described above, the temperature profile of the wafer 104 being processed is essentially the same. As seen by the graph in FIG. 12, in the first stage, the wafer 104 experiences an initial ramp up indicated by Region A 60 as discussed above in relation to FIGS. 6 and 7. Then the wafer is held at the offset temperature below the process target temperature and allowed to equilibrate as indicated by 420 on the graph. The temperature of the wafer 104 is then elevated at the second stage of the bake process through small controlled increments as indicated by Region B 62 and as discussed above in relation to FIGS. 6 and 7. Once at the process target temperature, the temperature is held constant at a steady state indicated by 422 on the graph, until processing has completed. The wafer is then cooled as seen in Region D 66 in FIG. 12.

The general process associated with the embodiments containing two separate heating sources such as the two hot plates described above in FIGS. 8A, B and 9A, B, can be seen in the flow chart in FIG. 13. A substrate, such as a semiconductor wafer, is transferred to a first heating source in block 430. The first heating source elevates a temperature of the substrate from an ambient temperature to an offset temperature less than the process target temperature in block 432. When the temperature of the substrate reaches the offset temperature, the substrate is held at that offset temperature to equilibrate the temperature in block 434. After the equilibration, the substrate is transferred from the first heating source to a second heating source, such as a second hot plate, in block 436. The second heating source elevates the temperature of the substrate to the process target temperature in small controlled increments in block 438. The temperature of the substrate is held at the process temperature (steady state) to complete the processing of the material on the substrate in block 440. After processing, the substrate is transferred to a cooling area to reduce the temperature of the substrate in block 442.

The process for the embodiment above containing a single heating source such as a single hot plate with multiple heating elements in FIGS. 10A, B, C and 11A, B, where some of the heating elements are capable of rapid heating, can be seen in the flow chart in FIG. 14. A substrate, such as a semiconductor wafer, is transferred to a multiple element heating source in block 450. At least some of the heating elements capable of rapid heating elevate the temperature of the substrate from ambient temperature to an offset temperature below the process target temperature in block 452. The substrate is held at the offset temperature and is allowed to equilibrate in block 454. The temperature of the substrate is then elevated to the process target temperature in controlled increments by additional heating elements in block 456. The temperature of the substrate is held at the process temperature to process the material on the substrate in block 458. The substrate is then transferred to a cooling area to reduce the substrate temperature.

Figure 15:
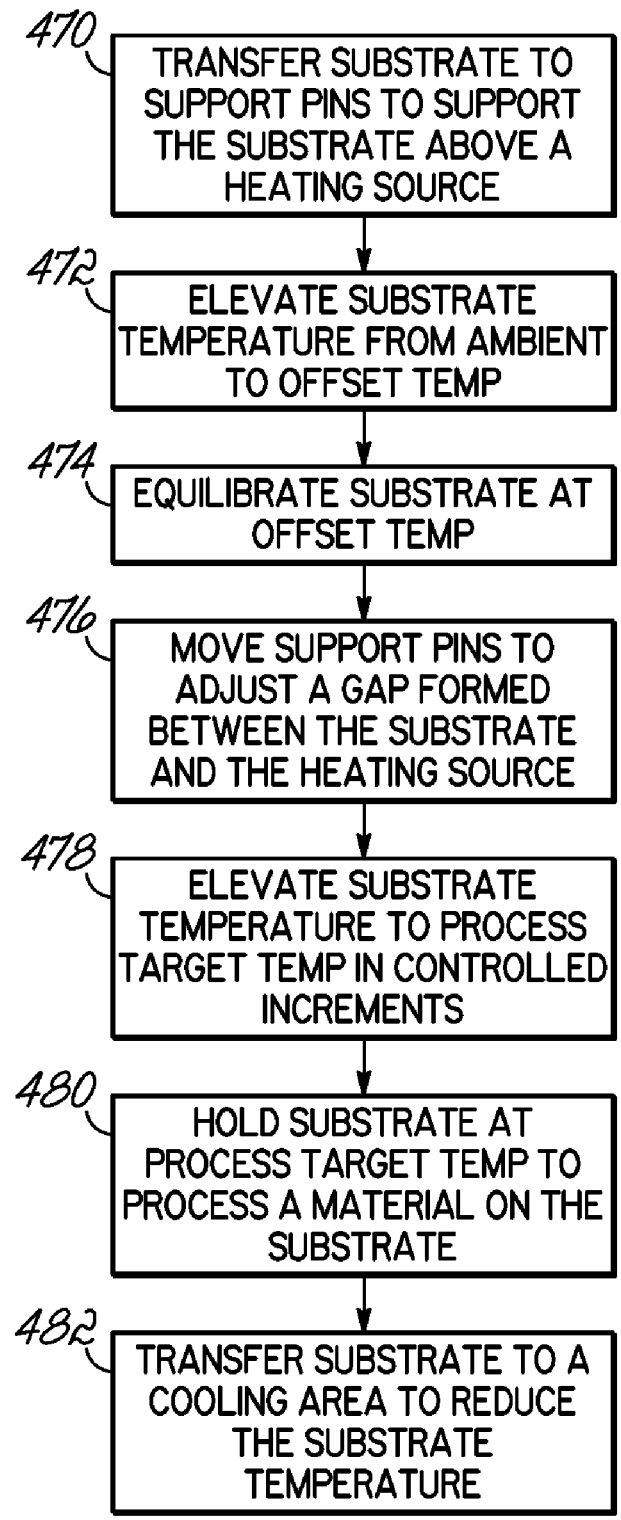
FIG. 15 is a flowchart showing an alternate process for the dual-stage bake consistent with the embodiment in FIGS. 11A and 11B.

The process for the alternate configuration of the embodiment above containing the single hot plate with moveable support pins can be seen in the flow chart in FIG. 15. A substrate, such as a semiconductor wafer, is transferred to support pins to support the substrate above a heating source in block 470. The heating source elevates a temperature of the substrate from an ambient temperature to an offset temperature less than the process target temperature in block 472. When the temperature of the substrate reaches the offset temperature, the substrate is held at that offset temperature to equilibrate the temperature in block 474. After the equilibration, the support pins supporting the substrate above the heading source raise the substrate to adjust the gap formed between the substrate and the heating source to a second heating source in block 476. The heating source then elevates the temperature of the substrate to the process target temperature in small controlled increments in block 478. The temperature of the substrate is held at the process temperature (steady state) to complete the processing of the material on the substrate in block 480. After processing, the substrate is transferred to a cooling area to reduce the temperature of the substrate in block 482.

It should be realized that any of the hot plates discussed above may be multi-zoned hot plates with each zone having its own controller. In other embodiments, the heating sources may be a source other than a hot plate with or without multiple heating elements.

While the present invention has been illustrated by a description of one or more embodiments thereof and while these embodiments have been described in considerable detail, they are intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A heat treatment apparatus for heating a substrate, the heat treatment apparatus comprising:
    a processing chamber containing a process space;
    a first substrate support in the process space, the first substrate support being configured to support the substrate in a spaced relationship with a first heating source to define a first heat exchange gap between the first heating source and the substrate, the first heating source configured to transfer heat energy through the first heat exchange gap to elevate a temperature of the substrate to an offset temperature below a process target temperature; and
    a second substrate support in the process space, the second substrate support being configured to support the substrate in a spaced relationship with a second heating source to define a second heat exchange gap between the second heating source and the substrate, the second heating source configured to transfer heat energy through the second heat exchange gap to elevate the temperature of the substrate from the offset temperature to the process target temperature in controlled increments.

2. The heat treatment apparatus of claim 1, wherein the process space of the processing chamber comprises:
    a first process space; and
    a second process space,
    wherein the first heat exchange gap and the first heating source are contained within the first process space,
    wherein the second heat exchange gap and the second heating source are contained within the second process space, and
    wherein the first and second process spaces are separated by a wall having an opening therein for transferring the substrate between the first and second process spaces.

3. The heat treatment apparatus of claim 2 wherein the first substrate support is located in the first process space and the second substrate support is located in the second process space, the heat treatment apparatus further comprising:
    a transport device in the process chamber configured to transfer the substrate from the first substrate support to the second substrate support after the temperature of the substrate is elevated to the offset temperature.

4. The heat treatment apparatus of claim 1 further comprising:
    a transport device configured to transfer the substrate from the first substrate support to the second substrate support after the temperature of the substrate is elevated to the offset temperature.

5. The heat treatment apparatus of claim 1 wherein the first heating source comprises a hot plate.

6. The heat treatment apparatus of claim 1 wherein the second heating source comprises a hot plate.

7. A method for heating a substrate inside a processing chamber, the method comprising:
    supporting the substrate in a spaced relationship with a first substrate support inside the processing chamber with the substrate separated from a first heating source by a first heat exchange gap;
    transferring heat energy from the first heating source through the first heat exchange gap and to the substrate for use in heating the substrate to an offset temperature below a process target temperature;
    holding the substrate at the offset temperature to equilibrate a temperature of the substrate;
    supporting the substrate in a spaced relationship with a second substrate support inside the processing chamber with the substrate separated from a second heating source by a second heat exchange gap; and
    transferring heat energy from the second heating source through the second heat exchange gap and to the substrate for use in heating the substrate from the offset temperature to the process target temperature in controlled increments.

8. The method of claim 7 further comprising:
    moving the substrate from the first substrate support to the second substrate support after the substrate has been heated to the offset temperature.

9. The method of claim 8 wherein the processing chamber includes a first processing chamber containing the first substrate support and a second processing chamber containing the second substrate support, the method further comprising:
    moving the substrate from the first substrate support in the first processing chamber to the second substrate support in the second processing chamber after the substrate has been heated to the offset temperature.

10. The method of claim 7 wherein the substrate has a top surface and a bottom surface, the method further comprising:
    supporting the substrate in a spaced relationship with the first substrate support inside the processing chamber with the top surface of the substrate spaced from the first heating source forming the first heat exchange gap.

11. The method of claim 7 wherein the substrate has a top surface and a bottom surface, the method further comprising:
    supporting the substrate in a spaced relationship with the second substrate support inside the processing chamber with the bottom surface of the substrate spaced from the second heating source forming the second heat exchange gap.

12. A method for heating a substrate inside a processing chamber, the substrate having a bottom surface, the method comprising:
    supporting the substrate in a spaced relationship with a substrate support inside the processing chamber with the bottom surface of the substrate separated from a heating source by a heat exchange gap;
    transferring heat energy from the heating source through the heat exchange gap and to the bottom surface of the substrate for use in rapidly heating the substrate to an offset temperature below a process target temperature; and holding the substrate at the offset temperature to equilibrate a temperature of the substrate;
transferring additional heat energy from the heating source through the heat exchange gap and to the bottom surface of the substrate for use in heating the substrate from the offset temperature to the process target temperature in controlled increments.

13. The method of claim 12 further comprising:
adjusting the spaced relationship between the bottom surface of the substrate and the heating source to vary the heat exchange gap after the temperature of the substrate has equilibrated at the offset temperature.

* * * * *